United States Patent
Ahn et al.

(10) Patent No.: US 6,762,090 B2
(45) Date of Patent: Jul. 13, 2004

(54) METHOD FOR FABRICATING A CAPACITOR

(75) Inventors: Byoung Kwon Ahn, Seoul (KR); Sung Hoon Park, Seoul (KR); Joon Ho Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/067,951

(22) Filed: Feb. 5, 2002

(65) Prior Publication Data

US 2003/0049908 A1 Mar. 13, 2003

(30) Foreign Application Priority Data

Sep. 13, 2001 (KR) ........................................ 2001-56504
Sep. 13, 2001 (KR) ........................................ 2001-56505

(51) Int. Cl.[7] ........................................ H01L 21/8242
(52) U.S. Cl. ........................ 438/239; 438/243; 438/254
(58) Field of Search ............................ 438/3, 239–240, 438/243–244, 253–254, 386–387

(56) References Cited

U.S. PATENT DOCUMENTS

| | | |
|---|---|---|
| 5,254,217 A | 10/1993 | Maniar et al. |
| 5,475,248 A | 12/1995 | Takenaka |
| 5,523,595 A | 6/1996 | Takenaka et al. |
| 5,581,436 A | 12/1996 | Summerfelt et al. |
| 5,629,229 A | 5/1997 | Si et al. |
| 5,866,926 A | 2/1999 | Takenaka |
| 5,946,542 A | 8/1999 | Iyer |
| 6,201,276 B1 | 3/2001 | Agarwal et al. |
| 6,204,069 B1 | 3/2001 | Summerfelt et al. |
| 6,214,724 B1 | 4/2001 | Nakajima |
| 6,218,256 B1 | 4/2001 | Agarwal |
| 6,391,660 B2 * | 5/2002 | Kweon et al. .................. 438/3 |

FOREIGN PATENT DOCUMENTS

| | | |
|---|---|---|
| JP | 4102367 | 4/1992 |
| JP | 5067792 | 3/1993 |
| JP | 6338599 | 12/1994 |
| JP | 8064763 | 3/1996 |
| JP | 9219497 | 8/1997 |
| JP | 11074458 | 3/1999 |
| JP | 022105 | 1/2000 |

* cited by examiner

Primary Examiner—Phat X. Cao
Assistant Examiner—Theresa T. Doan
(74) Attorney, Agent, or Firm—Ladas & Parry

(57) ABSTRACT

A method for fabricating capacitor capable of simplifying formation processes of ruthenium (Ru) layer for storage node electrode formation of capacitor comprises the steps of: forming a first insulating layer having a first opening exposing a predetermined region on a substrate; forming a conductive plug filled within the first opening; forming a second insulating layer having a second opening exposing the conductive plug on the first insulating layer; forming a conductive layer covering the second opening by sequentially performing PECVD and LPCVD processes on the second insulating layer; exposing the second insulating layer by performing etch back on the conductive layer; forming a storage node electrode of the capacitor by removing the second insulating layer; and forming a dielectric layer to cover the storage node electrode; and forming a plate electrode. In an alternative embodiment, a thermal treatment under an $N_2$ gas supply is performed after the step of forming the conductive layer.

16 Claims, 10 Drawing Sheets

METHOD FOR FABRICATING A CAPACITOR

BACKGROUND OF THE INVENTION

1. Field of the Invention

The present invention relates generally to a method for fabricating capacitor, and more particularly, to a method for fabricating capacitor capable of increasing capacitance and minimizing leakage current.

2. Description of the Related Art

As is generally known, there is a rapid increase in demand of memory devices resulting from the development of semiconductor fabrication methods. The capacitor is employed as a data storage means and the capacitance depends on electrode area, distance between electrodes and the dielectric constant of the dielectric layer interposed between electrodes. However, as semiconductor devices become highly integrated, the capacitor formation region and the electrode area of capacitor are decreased, thereby reducing capacitance.

Therefore, methods have been proposed to deposit a ruthenium (Ru) layer as a storage node electrode in Metal-Insulator-Metal (MIM) capacitors and a high dielectric TaON layer is deposited thereon and then, a metal layer is deposited on the dielectric layer, thereby maximizing the capacitance of the TaON capacitor.

FIGS. 1A to 1I are cross sectional views showing the steps of a conventional method for fabricating a capacitor.

Referring to FIG. 1A, a first insulating layer 104 is deposited with oxidized silicon on a semiconductor substrate 100, including over a conductive region 102, such as a source/drain, and then, the first insulating layer 104 is etched to expose the conductive region 102 in accordance with a photolithography process, thereby forming a first opening 106 as a storage node contact.

Referring to FIG. 1B, a polycrystalline silicon layer is deposited to cover the first opening 106 on the substrate 100, including over the first insulating layer 104 and then, an etch process is performed on the polycrystalline silicon layer to form a conductive plug 108. The conductive plug 108 is formed in the first opening 106 to a depth sunken from the top surface of the first insulating layer 104, as shown.

Referring to FIG. 1C, a Ti layer and a TiN layer are sequentially formed on the substrate 100 having the conductive plug 108 in accordance with known sputtering methods and then, etch back processes are performed on the Ti layer and the TiN layer to form a barrier metal layer a1, comprising layers 110,112, respectively.

Referring to FIG. 1D, a second insulating layer 121 is deposited on the resulting structure and then, the second insulating layer 121 is etched in accordance with a photolithography process, thereby forming a second opening 122 to which a part corresponding to the barrier metal layer a1 is exposed.

Referring to FIG. 1E, a first ruthenium (Ru) layer 140 for storage node electrode formation is deposited to cover the second opening 122 on the second insulating layer 121 in accordance with a Physical Vapor Deposition (PVD) process. The deposition of the first ruthenium (Ru) layer 140 is performed in a conventional CVD chamber (not shown).

Referring to FIG. 1F, a second ruthenium (Ru) layer is deposited on the first ruthenium (Ru) layer 140 in accordance with a Chemical Vapor Deposition (CVD) process, thereby obtaining a ruthenium (Ru) layer 142 having a desirable thickness. The deposition of the second ruthenium (Ru) layer is performed in a conventional CVD chamber (not shown) by transferring the substrate having deposited thereon the first ruthenium (Ru) layer 140 from the PVD chamber.

When the ruthenium (Ru) layer is deposited only in accordance with the CVD method, although the deposition speed is decreased on the surface of the first insulating layer, the quality of ruthenium Ru layer deteriorates. Therefore, the ruthenium (Ru) layer 142 for storage node electrode formation of a capacitor is formed by depositing the first ruthenium (Ru) layer 140 in accordance with the PVD process and then, depositing the second ruthenium (Ru) layer on the first ruthenium (Ru) layer 140 in accordance with the CVD process.

Referring to FIG. 1G, etch back processes are performed on the ruthenium (Ru) layer to expose the second insulating pattern 121, thereby forming a storage electrode 143 of the capacitor. Then, the second insulating pattern 121 is removed.

Referring to FIG. 1H, a dielectric layer 126 is formed to cover the storage electrode 143 of the capacitor and then, a plate electrode 130 of the capacitor is formed over the dielectric layer 126, as shown in FIG. 1I. Here, the dielectric layer 126 preferably is a TiON layer having a high dielectric constant and the plate electrode 130 is a ruthenium (Ru) layer formed by both PECVD and LPCVD processes, as is employed in the formation of the storage node electrode 143. Alternatively, instead of the ruthenium (Ru) layer, a TiN layer may be employed as the plate electrode 130.

However, according to the conventional method, both PVD and CVD processes are performed, respectively, during the steps for deposition of the ruthenium (Ru) layer for storage node electrode formation. Therefore, there is a problem in that extra process steps must be performed, such as transfer from the PVD chamber to the CVD chamber.

SUMMARY OF THE INVENTION

Therefore, the present invention has been made to solve the above-mentioned problems and the object of the present invention is to provide a method for fabricating a method for capacitor fabrication capable of simplifying formation processes of the ruthenium (Ru) layer for the storage node electrode formation of the capacitor.

In order to accomplish the above object, the present invention comprises the steps of: forming a first insulating layer having a first opening exposing a predetermined region; forming a conductive plug filled within the first opening; forming a second insulating layer having a second opening exposing the conductive plug on the first insulating layer; forming a conductive layer covering the second opening on the second insulating layer by sequentially performing PECVD and LPCVD processes; exposing the second insulating layer by performing etch back on the conductive layer; forming a storage node electrode of the capacitor by removing the second insulating layer; forming a dielectric layer covering the storage node electrode and forming a plate electrode.

Another alternative embodiment of the present invention comprises the steps of: forming a first insulating layer having a first opening exposing a predetermined region on a substrate; forming a conductive plug filled within the first opening; forming a second insulating layer having a second opening exposing the conductive plug on the first insulating layer; forming a conductive layer covering the second opening by sequentially performing PECVD and LPCVD processes on the second insulating layer; performing a first thermal treatment on the conductive layer under an atmosphere of $N_2$ gas; exposing the second insulating layer by performing etch back processes on the resulting conductive layer; forming a storage node electrode of the capacitor by removing the second insulating layer; forming a dielectric layer covering the storage node electrode; and forming a plate electrode covering the dielectric layer.

DETAILED DESCRIPTION OF THE INVENTION

The above objects, and other features and advantages of the present invention will become more apparent after reading the following detailed description when taken in conjunction with the appended drawings.

FIGS. 2A to 2H are cross sectional views for showing the steps of a method for fabricating a capacitor according to an embodiment of the present invention.

Figure 1A:
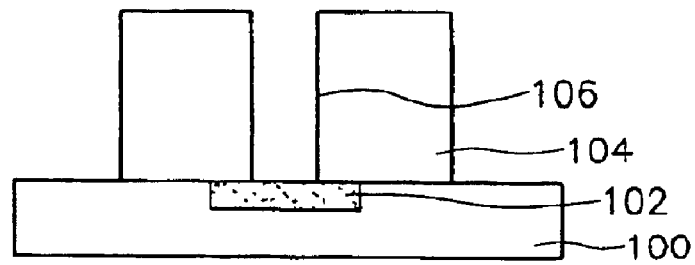
FIGS. 1A to 1I are cross sectional views for showing the steps of a conventional method for fabricating a capacitor.
Figure 1B:
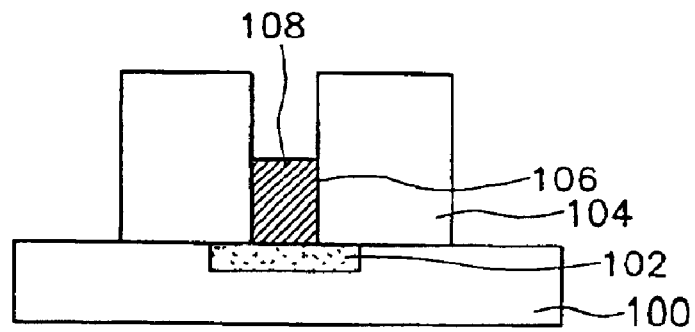
Figure 1C:
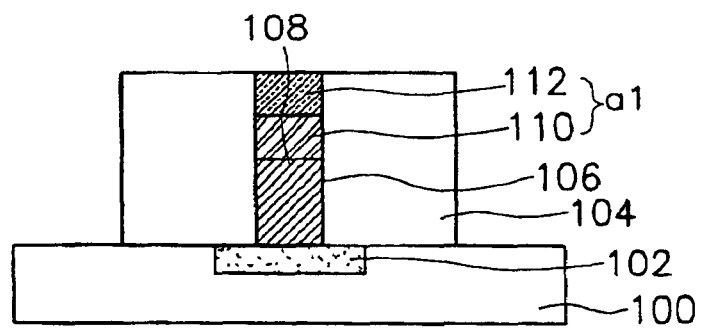
Figure 1D:
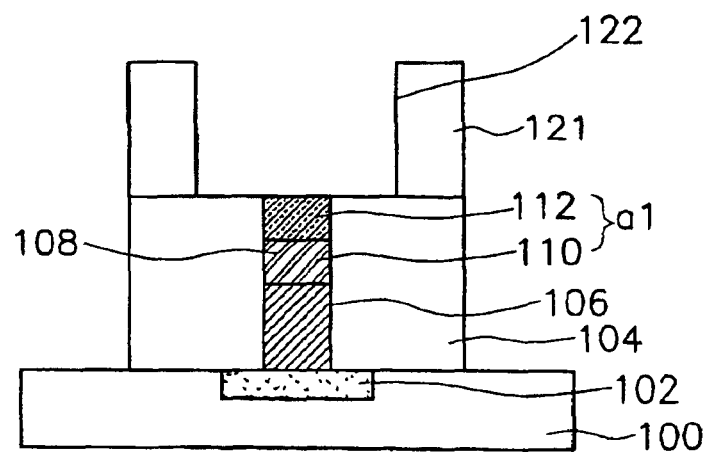
Figure 1E:
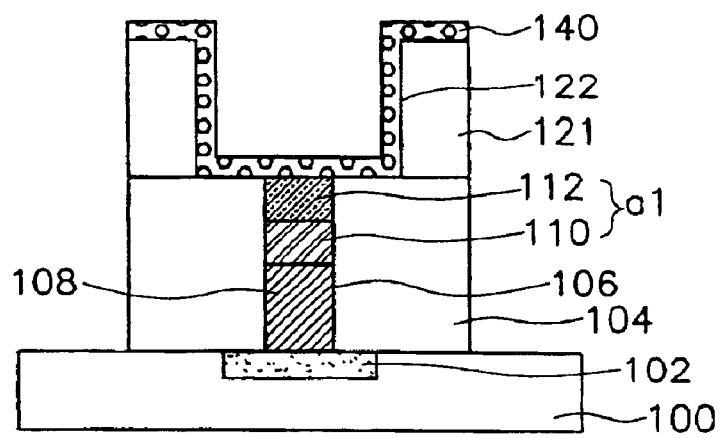
Figure 1F:
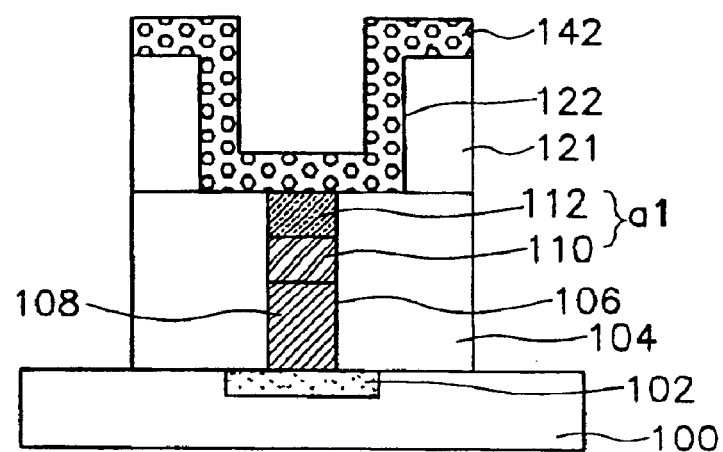
Figure 1G:
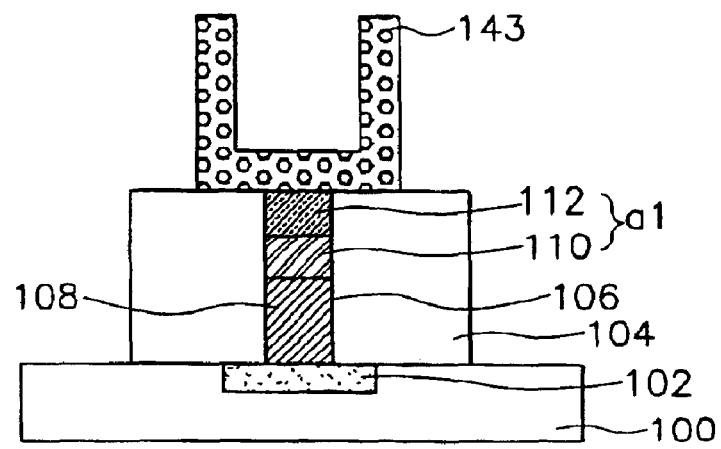
Figure 1H:
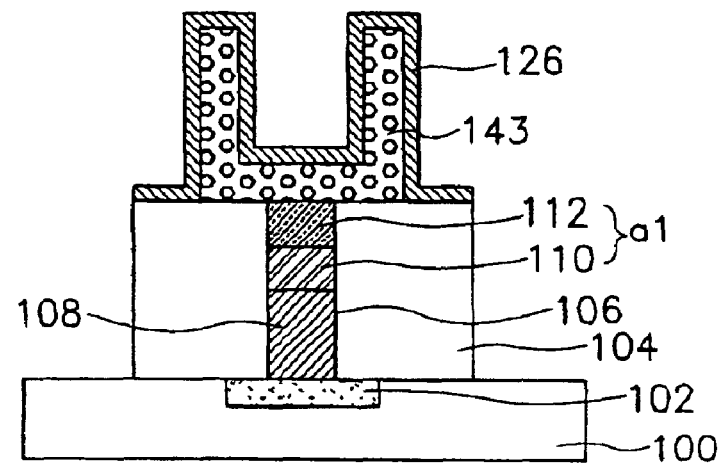
Figure 1I:
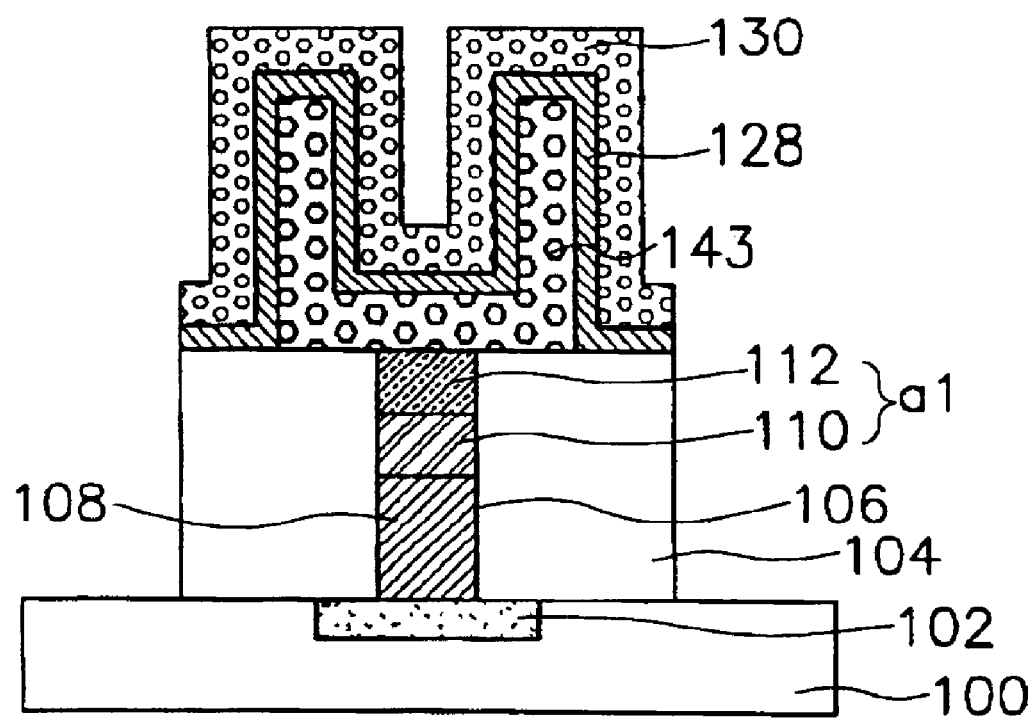
Figure 2A:
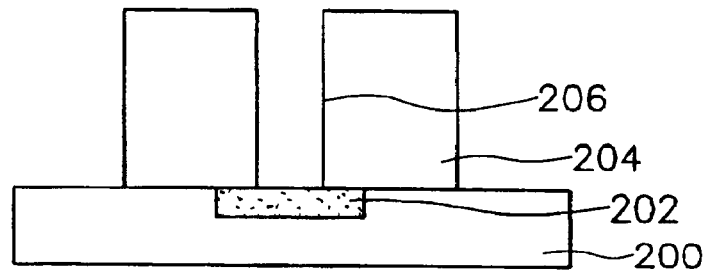
FIGS. 2A to 2H are cross sectional views for showing the steps of a method for fabricating a capacitor according to an embodiment of the present invention.

Referring to FIG. 2A, a first insulating layer 204 is deposited on a semiconductor substrate 200 including a conductive region 202, such as source/drain region and then, the first insulating layer 204 is etched in accordance with a known photolithography process, thereby forming a first opening 206 exposing the conductive region 202.

Figure 2B:
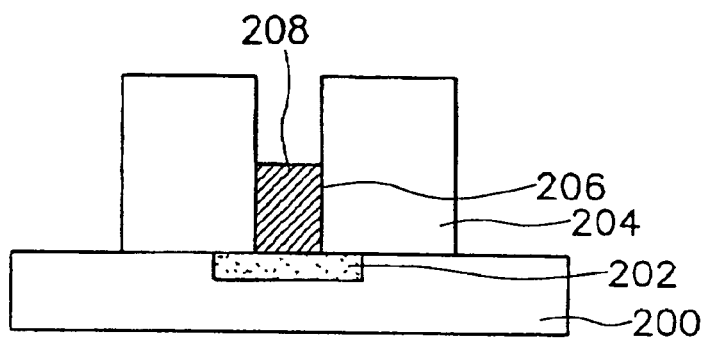

Referring to FIG. 2B, a polycrystalline silicon layer is deposited on the substrate 100, including over the first insulating layer 204 to cover the first opening 206, and then, the polycrystalline silicon layer is etched, thereby forming a conductive plug 208. The conductive plug 208 has a depth sunken from the surface of the insulating layer 204 since the polycrystalline silicon layer has an etching ratio higher than that of the first insulating layer 204.

Figure 2C:
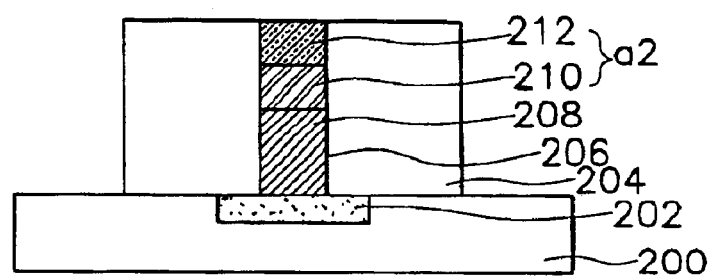

Referring to FIG. 2C, a Ti layer 210 and a TiN layer 212 are sequentially deposited on the resulting structure to cover the conductive plug 208 within the first opening 206. Then, the Ti layer and the TiN layer are subjected to etch back processes, thereby forming a barrier metal layer a2, as shown.

Figure 2D:
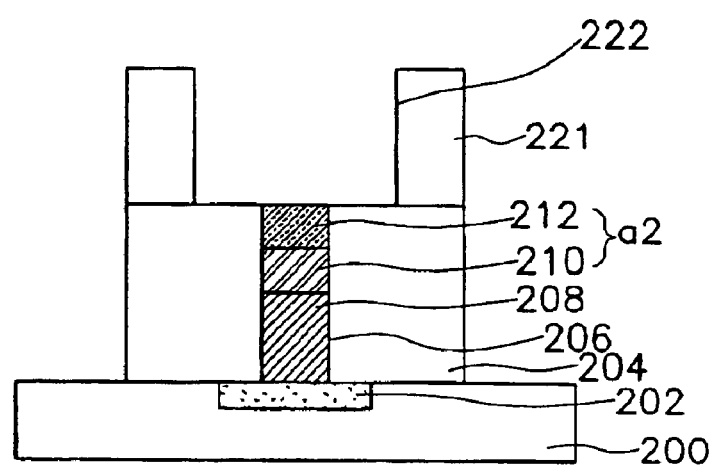

Referring to FIG. 2D, a second insulating layer 221 is deposited on the substrate 200, including over the barrier layer a2 and the first insulating layer 204, and then the second insulating layer 221 is etched in accordance with a known photolithography process, thereby forming a second opening 222 so that at least a part corresponding to the conductive plug 208 and the barrier metal layer a2 are exposed.

In the following processes, the second insulating layer 221 is employed as a sacrificial layer in order to form a storage node electrode of a capacitor.

Figure 2E:
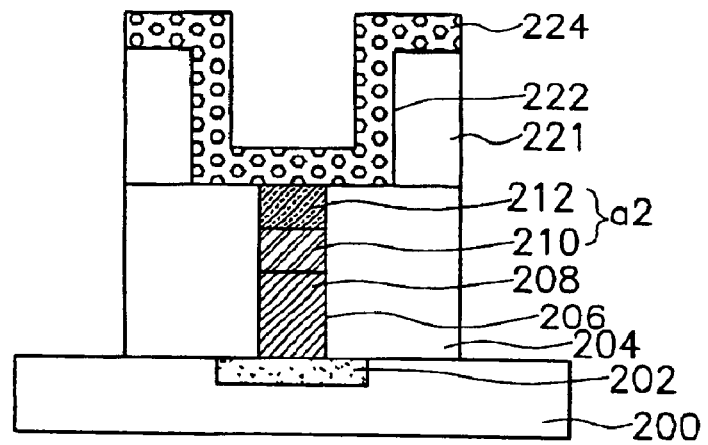

Referring to FIG. 2E, a ruthenium (Ru) layer 224 is deposited on the substrate including over the second insulating layer 221 to cover the second opening 222. The ruthenium (Ru) layer 224 is formed by depositing Tris(2,4-octanedionato)ruthenium as a source material in the CVD chamber (not shown) by a PECVD process and then, depositing over the resulting structure a second ruthenium (Ru) layer in the same CVD chamber by a LPCVD process.

The deposition of the ruthenium layer is performed under the conditions of an $O_2$ gas supplied into the CVD chamber at a flow rate of several tens to several hundreds sccm and the internal pressure of the CVD chamber is maintained in a range of from several mTorr to several Torr.

The deposition of ruthenium the (Ru) layer 224 is performed under conditions in which the temperature of the substrate is maintained at between 200 and 350° C. and the R.F. power is supplied in a range of from 100 to 300 Watts.

Figure 2F:
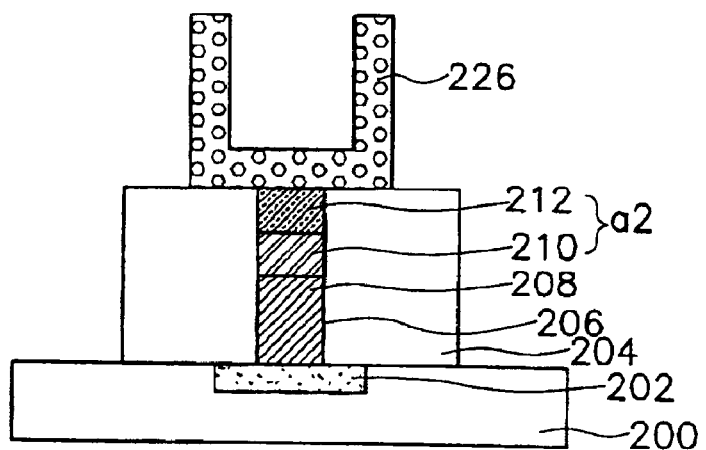

Referring to FIG. 2F, the ruthenium (Ru) layer is etched in accordance with a Chemical Mechanical Polishing (CMP) process until the surface of the second insulating layer 221 is exposed, thereby forming a storage node electrode 226 of the capacitor. Then, the second insulating layer 221 is removed.

Figure 2G:
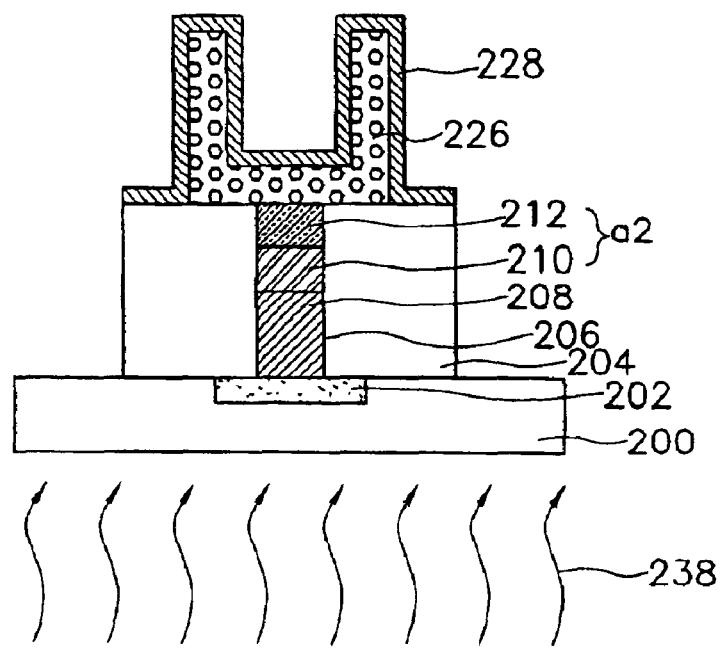

Referring to FIG. 2G, a dielectric layer 228 is formed to cover the storage node electrode 226 and then, a thermal treatment shown by arrows 238 is performed on the resulting structure at a temperature between 300 and 500° C. for 1 minute. The thermal treatment is preferably performed under conditions of a gas supply stream of gas selected from the group consisting of a supply of mixed gas of $N_2$ and $O_2$, a supply of mixed gas of $O_2$, $O_3$ and $N_2O$ and a supply of $O_3$ (ozone) under UV irradiation.

Here, the dielectric layer 228 preferably comprises a TiON layer and the TiON layer is formed under the conditions of a $TiCl_4$ source gas and $NH_3$ reaction gas supplied into the CVD chamber (not shown) at a flow rate of between 10 and 1000 sccm and the deposition process is performed on the substrate, which is heated to between 300 to 400° C. The CVD chamber is maintained at a temperature of between 170 to 190° C., at a pressure of between 0.1 and 1.2 Torr and an R.F. Power of between 10 and 500 Watts.

Figure 2H:
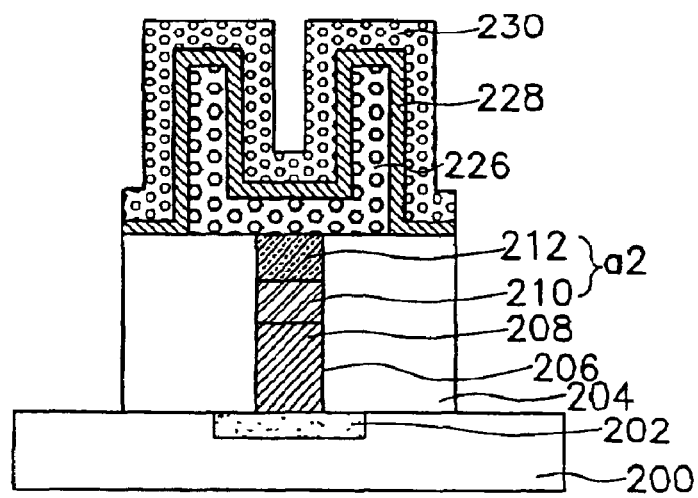

Referring to FIG. 2H, a plate electrode 230 is formed to cover the dielectric layer 228, thereby completing the capacitor fabrication according to an embodiment of the present invention. The plate electrode 230 is obtained by forming a ruthenium (Ru) layer with the same deposition method as that of the storage node electrode 226. Alternatively, a TiN layer is substituted for the ruthenium (Ru) layer.

Figure 3A:
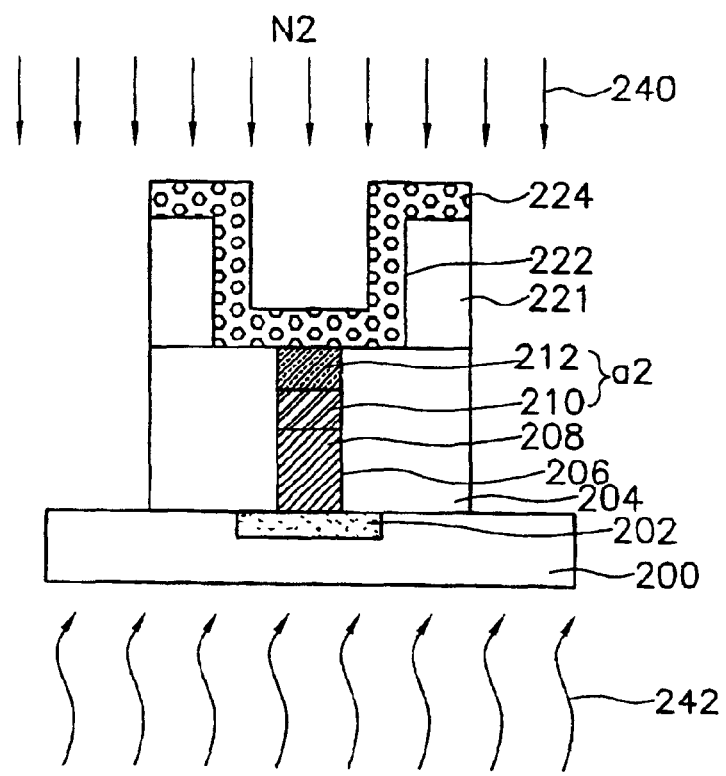
FIGS. 3A TO 3B are cross sectional view for showing a final step of a method for fabricating a capacitor according to another embodiment of the present invention.
Figure 3B:
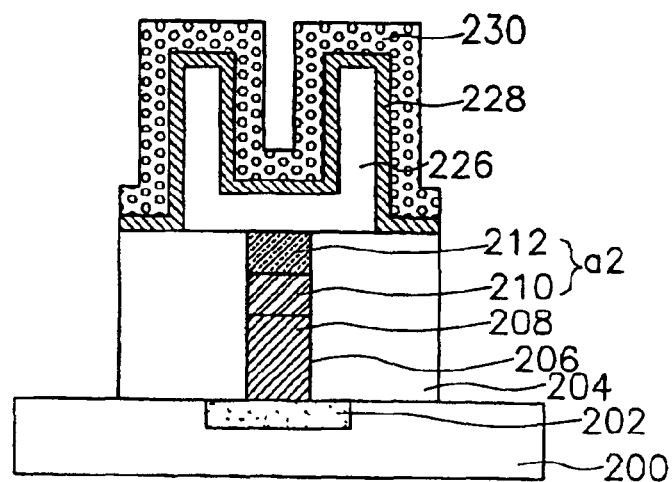

FIGS. 3A TO 3B are cross sectional view for showing a method step for fabricating capacitor according to another alternative embodiment of the present invention.

The second opening 222 is formed on the second insulating layer 221 with the same method as show in the embodiment of FIG. 2E of the present invention and then, the ruthenium (Ru) layer 224 is deposited to cover the second opening 222 on the substrate including over the second insulating layer 221. The ruthenium (Ru) layer 224 is formed by depositing Tris(2,4-octanedionato)ruthenium as a source material in the CVD chamber (not shown) by a PECVD process and then, depositing over the resulting structure a second ruthenium (Ru) layer in the same CVD chamber by a LPCVD process.

The deposition of ruthenium layer is performed under conditions of an $O_2$ gas supplied into the CVD chamber at a flow rate of several tens to several hundreds sccm and the internal pressure of the CVD chamber is maintained in a range of from several mTorr to several Torr.

The deposition of ruthenium (Ru) layer 224 is performed under conditions in which the temperature of the substrate is maintained at between 200 and 350° C. and the R.F. power is supplied in a range of from 100 to 300 Watts.

Then, as shown in FIG. 3A, a first thermal treatment, shown by arrows 242, is performed on the ruthenium (Ru) layer 224 by supplying $N_2$ gas 240 at a flow rate of between 10 sccm and 10 slm for between several seconds and hundreds of seconds at a temperature of between 600 and 1000° C.

And, the ruthenium (Ru) layer 224 is etched in accordance with a Chemical Mechanical Polishing (CMP) process until the surface of the second insulating layer 221 is exposed, as shown in FIG. 3B, thereby forming a storage node electrode 226 of the capacitor. Then, the second insulating layer 221 is removed.

A second thermal treatment (not shown) is performed on the dielectric layer 228 by supply $N_2$ gas at the temperature 500~650° C. in order to eliminate C and maintain nitrogen quantity of the TiON (dielectric layer 228).

Subsequently, the storage node electrode and the dielectric layer are formed in the shape of cylinder, thereby completing capacitor fabrication according to the alternative embodiment of the present invention.

As described above, according to an embodiment of the present invention, the ruthenium (Ru) layer for storage node electrode formation is deposited by sequentially performing PECVD and LPCVD processes in the same chamber, thereby eliminating steps and simplifying the fabrication processes.

According to the alternative embodiment of the present invention, $N_2$ supply and thermal treatment are further performed on the ruthenium (Ru) layer deposited by PECVD and LPCVD, thereby increasing the deposition rate and improving the quality of ruthenium (Ru) layer. Therefore, it is possible to realize a capacitor having high capacitance and low leakage current.

Although the preferred embodiments of the invention have been disclosed for illustrative purposes, those skilled in the art will appreciate that various modifications, alterations, additions and substitutions are possible, without departing from the scope and spirit of the invention as set forth in the accompanying claims.

What is claimed is:

1. A method for fabricating a capacitor comprising the steps of:
   forming a first insulating layer having a first opening exposing a predetermined region on a substrate;
   forming a conductive plug filled within the first opening;
   forming a second insulating layer having a second opening exposing the conductive plug on the first insulating layer;
   forming a conductive layer covering the second opening by sequentially performing PECVD and LPCVD processes on the second insulating layer in the same chamber;
   exposing the second insulating layer by performing etch back on the conductive layer;
   forming a storage node electrode of the capacitor by removing the second insulating layer;
   forming a dielectric layer to cover the storage node electrode; and
   forming a plate electrode.

2. The method for fabricating a capacitor according to claim 1, wherein the conductive layer comprises ruthenium (Ru).

3. The method for fabricating a capacitor according to claim 1, wherein the plate electrode comprises a ruthenium (Ru) layer or TIN layer.

4. The method for fabricating a capacitor according to claim 1, wherein the PECVD process and the LPCVD process are performed in a CVD chamber.

5. The method for fabricating a capacitor according to claim 1, wherein the conductive layer is formed under conditions of a temperature maintained at between 200 and 350° C. and power supplied between 100 and 300 Watts.

6. The method for fabricating a capacitor according to claim 1, wherein, after the stop of forming the conductive layer, further comprising the step of performing a first thermal treatment on the conductive layer in an atmosphere of $N_2$.

7. The method for fabricating a capacitor according to claim 6, wherein the first thermal treatment is performed by supplying $N_2$ gas at a flow rate of between 10 sccm and 10 slm at a temperature of between 600 and 1000° C.

8. The method for fabricating a capacitor according to claim 1, wherein the dielectric layer comprises TiON.

9. The method for fabricating a capacitor according to claim 8, wherein the TiON layer is formed by supplying $TiCl_4$ source gas and $NH_3$ reaction gas at a flow rate of between 10 and 1000 sccm, maintaining the inside of the chamber at a temperature between 170 and 190° C.

10. The method for fabricating a capacitor according to claim 8, wherein the TiON layer is formed under conditions of pressure of the chamber maintained at between 0.1 and 1.2 Torr and the temperature of substrate is maintained at between 300 and 400° C.

11. The method for fabricating a capacitor according to claim 1, wherein, after the step of forming the dielectric layer, further comprising the step of performing a second thermal treatment on the dielectric layer.

12. The method for fabricating a capacitor according to claim 11, wherein the second thermal treatment is performed at a temperature of between 300 and 500° C. for 1 minute.

13. The method for fabricating a capacitor according to claim 11, wherein the second thermal treatment is performed at a temperature of between 500 and 650° C. by using $N_2$ gas.

14. The method for fabricating a capacitor according to claim 11, wherein the second thermal treatment is performed by supplying a mixed gas comprising $N_2$ and $O_2$ in a plasma state.

15. The method for fabricating a capacitor according to claim 11, wherein the second thermal treatment is performed by supplying a mixed gas comprising $O_2$, $O_3$ and $N_2O$.

16. The method for fabricating a capacitor according to claim 11, wherein the second thermal treatment is performed by supplying $O_3$ under UV radiation.

* * * * *